United States Patent [19]

Noguchi

[11] Patent Number: 5,739,572
[45] Date of Patent: Apr. 14, 1998

[54] HIGH VOLTAGE SEMICONDUCTOR DEVICE

[75] Inventor: Ko Noguchi, Tokyo, Japan

[73] Assignee: NEC Corporation, Tokyo, Japan

[21] Appl. No.: 794,644

[22] Filed: Feb. 3, 1997

Related U.S. Application Data

[62] Division of Ser. No. 607,424, Feb. 28, 1996.

[30] Foreign Application Priority Data

Feb. 28, 1995 [JP] Japan ............................. 7-040185

[51] Int. Cl.$^6$ ............................. H01L 29/76; H01L 29/94
[52] U.S. Cl. ............................. 257/371; 257/338
[58] Field of Search ............................. 257/335, 337, 257/338, 341, 343, 344, 369, 371

[56] References Cited

U.S. PATENT DOCUMENTS

| | | | |
|---|---|---|---|
| 4,923,824 | 5/1990 | Fertig et al. | 437/44 |
| 5,047,358 | 9/1991 | Kosiak et al. | 437/34 |
| 5,286,995 | 2/1994 | Malhi | 257/343 |
| 5,356,822 | 10/1994 | Lin et al. | 437/34 |

FOREIGN PATENT DOCUMENTS

| | | |
|---|---|---|
| 61-174666 | 8/1986 | Japan . |
| 1-64251 | 3/1989 | Japan . |

OTHER PUBLICATIONS

S. Ghandhi, *VLSI Fabrication Principles, Silicon and Gallium Arsenide*, pp. 346–348 (1983).
S. Wolf, *Silicon Processing for the VLSI Era*, pp. 383–386 (1990).

*Primary Examiner*—Wael Fahmy
*Attorney, Agent, or Firm*—Sughrue, Mion, Zinn, Macpeak & Seas, PLLC

[57] ABSTRACT

A high voltage semiconductor device includes a low voltage CMOSFET and a p-channel high voltage MOSFET having a drain formed in a p-well and a source in an n-well. The p-well has a bottom flush with the bottom of the n-well, and a heavily doped n-well is further provided at the bottom surface of the p-well at least a part of the bottom surface of the n-well. The high voltage MOSFET has a large rated voltage and is suited for fabrication in a finer structure.

11 Claims, 7 Drawing Sheets

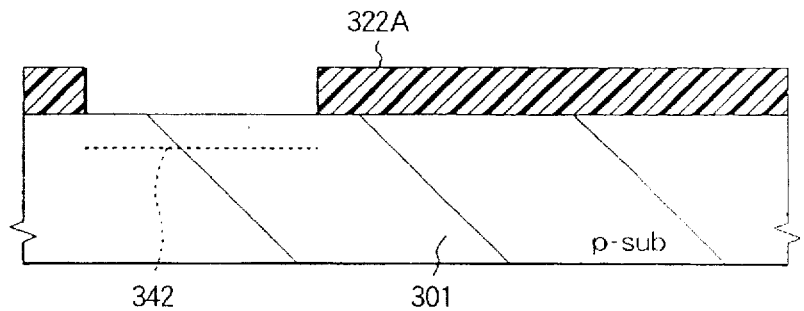
FIG. 1A
PRIOR ART
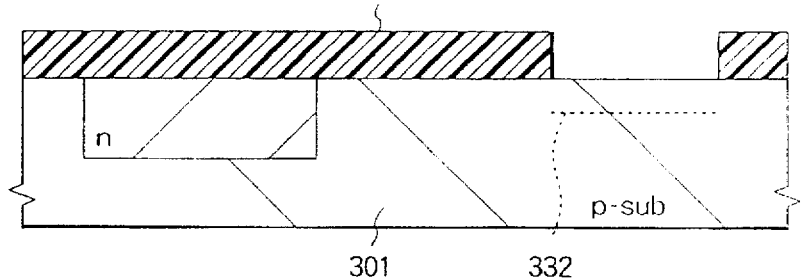
FIG. 1B
PRIOR ART
FIG. 1C
PRIOR ART
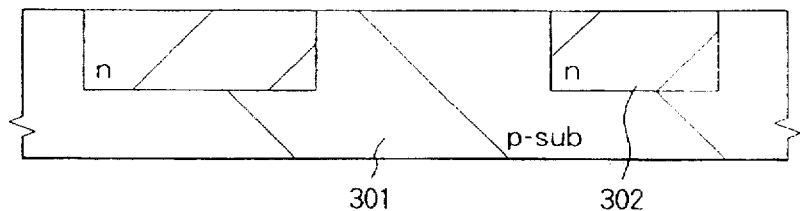
FIG. 1D
PRIOR ART

HIGH VOLTAGE SEMICONDUCTOR DEVICE

This is a divisional of application Ser. No. 08/607,424 filed Feb. 28, 1996 pending.

BACKGROUND OF THE INVENTION (a) Field of the Invention

The present invention relates to a high voltage semiconductor device and, more particularly, to a high voltage semiconductor device including a high voltage MOSFET and a low voltage CMOSFET. The present invention also relates to a method for manufacturing such a high voltage semiconductor device.

(b) Description of the Related Art

An example of a conventional high voltage semiconductor device used in a drive circuit for a fluorescent character display tube will be described first. The final stage of such a high voltage semiconductor device includes a p-channel high voltage MOSFET, the drain region of which is supplied with a high (absolute) voltage of about −40 V with respect to the source region thereof. The drain region acting as an output terminal of the high voltage semiconductor device is connected to an input terminal of a fluorescent character display tube. In this case, the fluorescent character display tube is in an ON state when the MOSFET is in an ON state.

The inventor has previously proposed a high voltage semiconductor device in an application published as Patent Publication No. JP-A-1989-64251. The high voltage semiconductor device has an internal circuit including CMOSFETs, and a p-channel high voltage MOSFET acting as the final stage transistor of the output buffer for the internal circuit. The high voltage MOSFET is provided at the surface of a first n-well formed at the surface of a p-conductive silicon substrate (p-substrate). The drain region of the MOSFET includes a p-well provided at the surface of the first N-well and a p-diffused region, which is formed at the surface of the p-well by self-alignment with a field oxide film. The gate electrode of the high voltage MOSFET overlies, with the intervention of a gate oxide film, both a channel region formed by the first n-well and the p-well adjacent to the channel region, and extends to partially cover the field oxide film. An n-channel MOSFET of a CMOS is provided at the surface of the p-substrate, and a p-channel MOSFET of the CMOS is provided at the surface of a second n-well having a junction depth smaller than that of the first n-well.

In the high voltage semiconductor device as described above, the CMOSFETs implementing the internal circuit of the semiconductor device are not formed in twin wells. Therefore, a finer high voltage semiconductor device meeting a sub-micron design rule cannot be fabricated using the structure disclosed in the patent publication as it is. The inventory carried out further experiments and evaluation so as to study the feasibility of a finer high voltage semiconductor device meeting a sub-micron design rule based on the high voltage semiconductor device disclosed in the patent publication.

Referring to FIGS. 1A through 1H, a description will be given of a method for manufacturing a high voltage semiconductor device meeting a 0.5 μm design rule based on the high voltage semiconductor device disclosed in the patent publication.

First, phosphorous ions are implanted into a p-substrate 301 by using a photoresist film 322A as a mask which has an opening corresponding to a region which contains a site where a p-channel high voltage MOSFET is to be formed, whereby a phosphorous ion implanted region 342 is formed within p-substrate 301 (FIG. 1A). After removal of the photoresist film 322A, an n-well 312 is formed at the surface of p-substrate 301 by using a heat treatment for activation of the implanted ions. The junction depth of n-well 312 is about 3.5 μm (FIG. 1B).

Subsequently, phosphorous ions are implanted into p-substrate 301 by using a photoresist film 322B as a mask which has an opening corresponding to a region which contains a site where a p-channel MOSFET of a CMOS is to be formed, whereby a phosphorous ion implanted region 382 is formed in p-substrate 301 (FIG. 1C). After removal of photoresist film 322B, another n-well 302 is formed at the surface of p-substrate 301 by using a heat treatment. The junction depth of n-well 302 is about 3 μm (FIG. 1D).

Further, boron ions are implanted into p-substrate 301 by using a photoresist film 823A as a mask which has an opening corresponding to a region which contains a site where an n-channel MOSFET of the CMOS is to be formed, whereby a boron ion implanted region 333 is formed in p-substrate 301 (FIG. 1E). After removal of photoresist film 323A, ion implantation is further performed using a photoresist film 323B as a mask which has an opening exposing a portion of n-well 312 to be formed as drain region of the p-channel high voltage MOSFET. With this implantation, a boron ion implanted region 343 is formed in n-well 312. A designed minimum overlap, which is defined by a photo mask, between photoresist film 323B and n-well 312 is about 1.5 μm (FIG. 1F). After removal of photoresist film 323B, a heat treatment is performed to form a p-well 303 at a surface region of p-substrate 301 and to form a p-well 313 at a surface region of n-well 312. The junction depths of p-wells 303 and 313 are about 2 μm and about 1.5 μm, respectively. The distance between p-well 303 and n-well 302 is about 1 μm, while the distance between p-well 303 and n-well 312 is about 2 μm (FIG. 1G).

Next, a field oxide film 304 having a thickness of about 0.3 μm is formed on the surface of p-substrate 301 by using a selective oxidization method. The field oxide film 304 has a first opening 351 on the surface of p-well 313, a second opening 352 provided separately from the first opening 351 to extend from the edge portion of p-well 313 to N-well 312, a third opening 353 on the surface of n-well 302, and a fourth opening 354 on the surface of p-well 303. That is, these first through fourth openings are not oxidized by the selective oxidization. A gate oxide film 305 having a thickness of about 10 nanometers (nm) is formed on p-substrate 301 in regions corresponding to the first through fourth openings.

Subsequently, gate electrodes 306a, 306b and 306c are formed. Gate electrode 306a covers part of the second opening 352, with the intervention of gate oxide film 305, and also covers part of p-well 313 with the intervention of part of field oxide film 304 located between the first opening 351 and the second opening 352. The gate length of gate electrode 306a is about 5 μm, and the width of the portion where gate electrode 306a covers field oxide film 304, i.e., the width of the portion where gate electrode 306a covers the surface of p-well 313 with the intervention of field oxide film 304 is about 1 μm.

The width of the portion where gate electrode 306a covers the surface of p-well 313 with the intervention of gate oxide film 305 is about 1 μm, and the width of the portion where gate electrode 306a covers the surface of n-well 312 with the intervention of gate oxide film 305 is about 3 μm. Gate electrode 306b covers part of the third opening 353 with the intervention of gate oxide film 305. Gate electrode 306c covers part of the fourth opening 354 with the intervention of gate oxide film 305. The gate electrodes 306b and 306c have a length of about 0.5 μm each.

Boron difluoride (BF$_2$) ions are implanted through the first through third openings by using an unillustrated photoresist film covering the fourth opening. gate electrodes 306a and 306b and field oxide film 304 as a mask. As a consequence, a p$^{30}$ diffused region 307a constituting a part of the drain of the high voltage MOSFET is formed, by self-alignment with field oxide film 304, in a surface region of p-well 313 which corresponds to the first opening 351, another p$^{30}$ diffused region 307b constituting the source of the high voltage MOSFET is formed, by self-alignment with field oxide film 305 and gate electrode 306a, in a surface region of n-well 312 which corresponds to part of the second opening 352, and p$^{30}$ diffused regions 307c constituting the source and drain of the CMOSFET are formed, by self-alignment with field oxide film 304 and gate electrode 306b, in surface regions of n-well 302 which correspond to the third opening 353.

Subsequently, arsenic ions, for example, are implanted using an unillustrated photoresist film covering at least the first through third openings, gate electrode 306b and field oxide film 304 as a mask. As a result, n$^+$ diffused regions 308 are formed, by self-alignment with field oxide film 304 and gate electrode 306c, in surface regions of p-well 303 which correspond to the fourth opening 354. By the process as described above, a desired p-channel high voltage MOSFET and CMOSFET are formed.

In the high voltage semiconductor device as described above, the p-channel high voltage MOSFET is formed-a the surface of n-well 312 and includes a drain region formed by p-well 313 and p$^{30}$ diffused region 307a, a source region formed by p$^{30}$ diffused region 307b Formed in n-well 312, gate oxide film 305, and gate electrode 306a. The p-channel MOSFET of the CMOS is formed at the surface of n-well 302 and includes source and drain regions formed by a pair of P$^{30}$ diffused regions 307c, gate oxide film 305 and gate electrode 306b. The n-channel MOSFET of the CMOS is formed at the surface of p-well 803 and includes source and drain regions formed by a pair of n$^{30}$ diffused regions 308, gate oxide film 305 and gate electrode 306c.

The p-channel high voltage MOSFET can operate substantially without causing problems even when a voltage of about −40 V is supplied to the drain region with respect to the source region. Since the bottom surface of n-well 312 is located below the bottom surface of p-well 313 by an amount of about 2 μm, punch-through will not occur between p-well 313 and p-substrate 301 in the vertical direction even when the high voltage of about −40 V is supplied to the drain region of the transistor.

On the surface of p-substrate 301, the designed minimum width for the portion of n-well 312 disposed between p-well 313 and p-substrate 301 is 1.5 μm, and the impurity concentration at that portion is higher than that of the portion of n-well 312 beneath the bottom portion of p-well 313, which fact enlarge the portion of n-well 312 disposed between p-well 313 and p-substrate 301 in a lateral direction. Accordingly, no punch-through occurs between p-well 313 and p-substrate 301 also in a lateral direction.

A finer high voltage semiconductor device meeting a 0.5 μm design rule and based on the high voltage semiconductor device disclosed in Patent Publication No. JP-A-1989-64251 should have a maximum absolute operating voltage equal to or greater than 40 V, and should be free from punch-through between the drain region and the silicon substrate.

However, when the designed distance determined by the mask between n-Well 312 and p-well 303 decreases for request in a finer structure, the effective width of n-well 312 in the lateral direction decreases accordingly, so that possibility of lateral punch-through occurring at a relatively deep position increases to a significant level.

If a p$^{30}$ diffused region constituting the drain region of a p-channel high voltage MOSFET is formed by self-alignment with the gate electrode, as disclosed in Patent Publication No. JP-A-1986-174667. For example, and no field oxide film is Formed on the surface of the p-well between the channel region and the p$^{30}$ diffused region, the maximum operating voltage of the high voltage MOSFET is only about 15 V and cannot be increased up to −40 V. The reason for the low maximum operating voltage in this transistor-is that electric field relaxing effect does not occur to a sufficient level between the p$^{30}$ diffused region (307a) and the channel region because no field oxide film exists on the surface of the p-well (313) between the channel region and the p$^{30}$ diffused region (307a) in the MOSFET of this publication

SUMMARY OF THE INVENTION

It is an object of the present invention to improve upon the high voltage semiconductor devices, which include a high voltage MOSFET of the type as disclosed in JP-A-1989-6251 to be fabricated in a finer structure.

Another object of the present invention is to provide a method for manufacturing the high voltage semiconductor device as described above.

A semiconductor device in one aspect of the present invention comprises a semiconductor substrate of a first conductivity type; a first well of a second conductivity type opposite to the first conductivity type, the first well being formed in an annular first surface region of the substrate; a second well of the first conductivity type formed in a second surface region of the substrate surrounded by the first surface region, the second well having a side surface coupled to a side surface of the first well and a bottom surface substantially flush with a bottom surface of the first well; a third well of the second conductivity type formed within the substrate, the third well being coupled to the bottom surface of the second well and at least a part of the bottom surface of the first well, the third well having an impurity concentration higher than an impurity concentration of the first well; and a MOSFET having a source formed in the first well, a drain formed in the second well, the source and drain being of the first conductivity type.

The semiconductor device according to the present invention is suited for a high voltage semiconductor device including a high voltage MOSFET. The "high voltage MOSFET" as used in the present invention means a MOSFET having a rated voltage of about 35 volts or higher.

The method for manufacturing a semiconductor device according to the present invention includes the steps of implanting first impurity ions of a first conductivity type into a first region of a semiconductor substrate; activating the first impurity ions in the first region to form a first well; implanting second impurity ions of a second conductivity type opposite to the first conductivity type into second region of the semiconductor substrate; activating the second impurity ions in said second region to from a second well; implanting third impurity ions of the first conductivity type into a third region located under at least a part of the first region and the second region; activating the third impurity ions in said second region to form a third well located under and coupled to a part of the first well and the second well; and forming a MOSFET having a drain in the second well and a source in the first well.

In accordance with the present invention, since the third well having a higher impurity concentration is provided beneath the bottom of the second well instead of a portion of the first well, the third well more effectively prevents punch-through than the portion of the first well does between the drain region of the high voltage MOSFET and the substrate because of the junction formed by the substrate and the third well of the higher impurity concentration in the present invention.

Further, since the third well is coupled to the first well and the second well while having a higher impurity concentration than the first well, a high voltage surge pulse entering the drain region of the high voltage MOSFET causes breakdown of the junction between the second well and the third well rather than the junction between the second well and the first well. That is, the breakdown of the junction between the source and drain occurs at a deep position of the second well, which fact prevents an electrostatic breakdown of the gate oxide film.

Accordingly, it is unnecessary to provide a protection diode for this purpose.

The present invention makes it possible to fabricate a finer high voltage semiconductor device having a high reliability.

The above and other objects, features and advantages of the present invention will be more apparent from the following description with reference to accompanying drawings.

BRIEF DESCRIPTION OF THE DRAWINGS

FIGS. 1A through 1It are schematic sectional views of a conventional high voltage semiconductor device, which includes a high voltage MOSFET and a CMOS, in consecutive steps of a method for manufacturing the semiconductor device;

DETAILED DESCRIPTION OF THE PREFERRED EMBODIMENTS

Figure 1E:
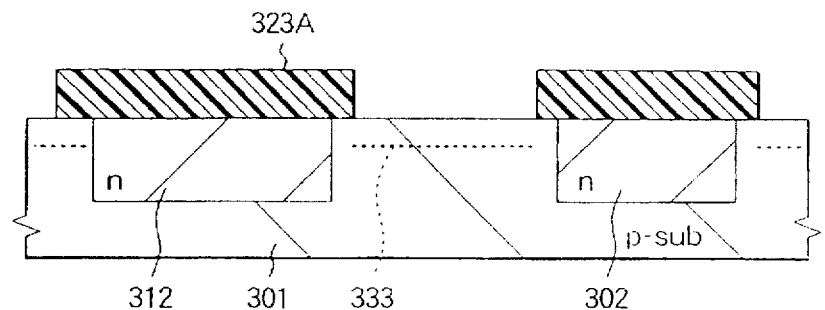
Figure 1F:
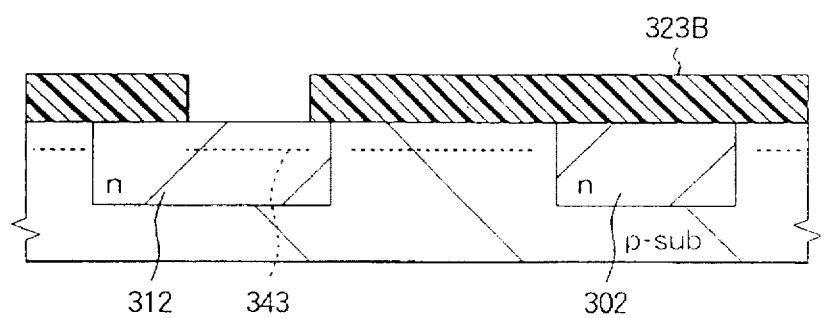
Figure 1G:
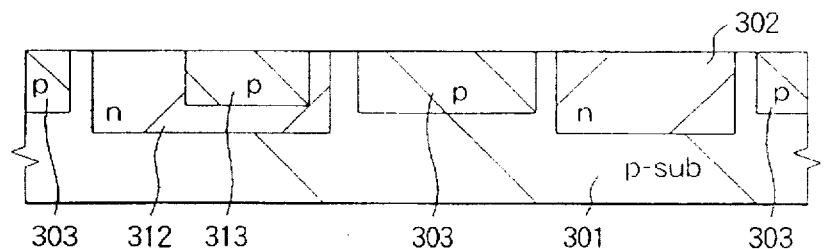
Figure 1H:
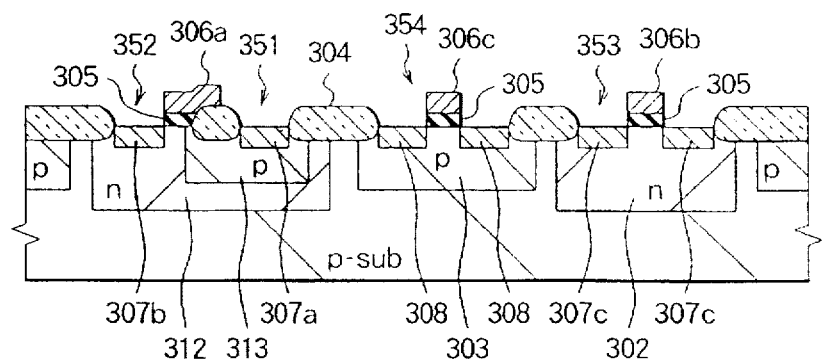

Before describing preferred embodiment of the present invention, disadvantages of the prior art will be described for the sake of understanding of the present invention.

The inventor further studied the conventional high voltage semiconductor device disclosed in Patent Publication No. JP-A-1989-64251, and found some problems which will be detailed below.

In the conventional high voltage semiconductor device, the junction depth of n-well 312 must be located deeper than the junction of p-well 313 by a certain amount, for example about 2 μm, so as to prevent punch-through between p-well 313 forming part of the drain region and p-substrate 301. Therefore, the following two problems occur.

First, a lateral extension or increase of n-well 312 from a designed width in the product cannot be ignored due to the spreading of ions during ion implantation because the junction depth of n-well 312 is deeper than that of p-well 313 by the certain amount. Accordingly, the designed distance determined by a mask between n-well 312 and p-well 303 must be set equal to or above about 2 μm, for example, in order to form an reliable junction therebetween.

That is, in a more generalized expression, if a high voltage MOSFET having a first-conductive (i.e., p-conductive, for example) channel and a drain region partly formed by a first first-conductive well is provided in a first second-conductive (i.e., n-conductive, for the example as mentioned above) well at the surface of a first-conductive substrate, and CMOS formed of a MOSFET having a first-conductive channel and a MOSFET having a second-conductive channel arid implementing an internal circuit, are respectively provided in a second second-conductive well and a second first-conductive well, both formed at the surface of the first-conductive substrate, the area occupied by the high voltage MOSFET must be increased by an amount corresponding to a lateral extension of the first second-conductive well from the designed width thereof; which lateral extension corresponds to the junction depth of the first second-conductive well. Therefore, it is difficult to fabricate in a more Fine structure the high voltage semiconductor device including a high voltage MOSFET having a First-conductive channel.

Although another designed distance between p-well 303 and N-well 302 was set to about 1 μm in the experiment for evaluation, it was proved that this distance could be decreased down to zero.

The second problem relates to electrostatic breakage of the gate oxide film. In the high voltage MOSFET subjected to experiments for evaluation, electrostatic breakage occurred when the high voltage transistor was OFF, although such a problem did not occur when the high voltage MOSFET was ON. The impurity concentration of n-well 312 was lower at a deeper position in the n-well. When noise having a negative potential was applied from a power supply line to $p^{30}$ diffused region 307a constituting the drain of the high voltage MOSFET during an OFF state thereof, breakdown of p-well 313 did not occur at the bottom of p-well 313 but occurred in the vicinity of the surface thereof, i.e., in the vicinity of the channel region. The breakdown at the surface region resulted in a breakage of the gate oxide film 305.

The breakage of the gate oxide film may be prevented by providing a protection diode having a maximum rated voltage of, for example, 45 V which is greater, by a certain amount, than the absolute power supply voltage (for example, 40 V) supplied to the drain region of the high voltage MOSFET with respect to the source region. However, such a protection diode occupies a considerably large area, so that it is difficult to manufacture a finer structure of the high voltage semiconductor device including a high voltage MOSFET and a CMOSFET. The present invention is devised to solve those problems in the conventional high voltage semiconductor device as described above.

Embodiments of the present invention will now be described.

Figure 2A:
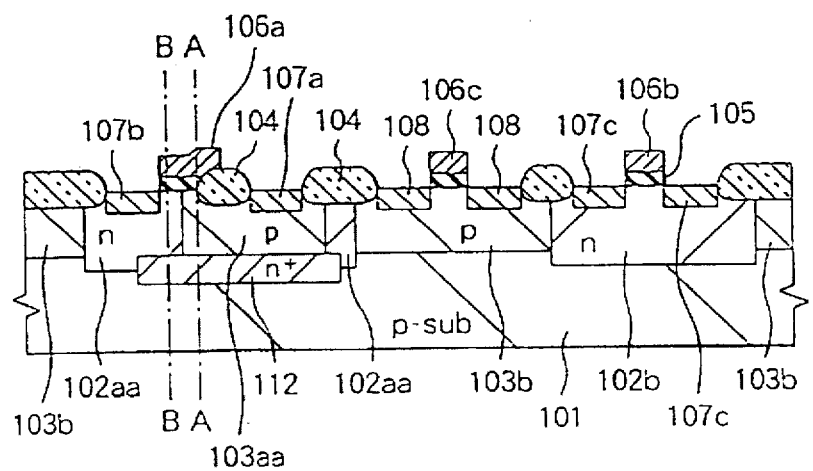
FIG. 2A is a schematic sectional view of a high voltage semiconductor device, which includes a high voltage MOSFET and a CMOS, according to a first embodiment of the present invention.
Figure 2B:
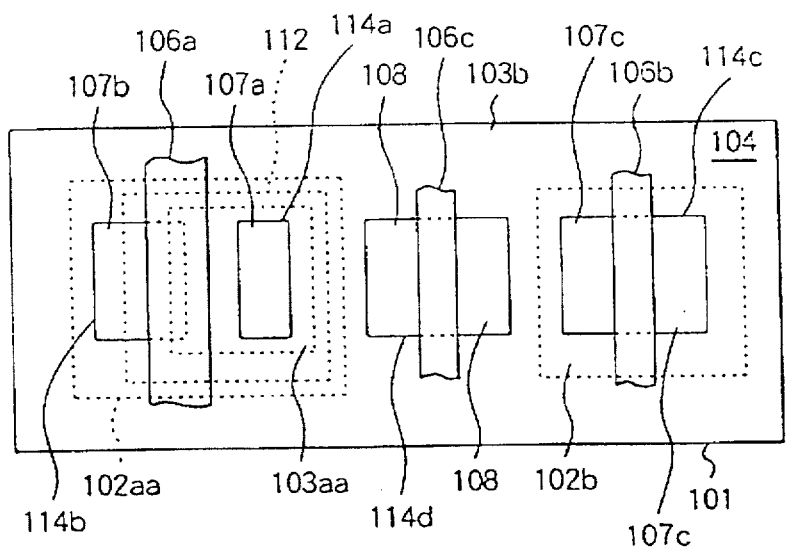
FIG. 2B is a schematic top plan view of the high voltage semiconductor device shown in FIG. 2A.

Referring to FIGS. 2A and 2B, a high voltage semiconductor device according to a first embodiment of the present invention includes a p-channel high voltage MOSFET and a CMOSFET which are designed in accordance with a 0.5 µm design rule. The high voltage semiconductor device is suitable for driving a fluorescent character display tube.

A first n-well 102aa having a junction depth of about 1.2 µm is provided in an annular first surface region of a p-conductive silicon substrate (p-substrate) 101. In a second surface region of p-substrate 101, separately located from the first surface region, a second n-well 102b is provided which has the same junction depth and impurity concentration (i.e., the same impurity concentration profile) as those of n-well 102aa. In a third surface region of p-substrate 101 surrounded by the annular first surface region, a first p-well 103aa is provided which has a junction depth of about 1.0 µm. In the fourth surface region of p-substrate 101 a second p-well 103b is provided which has the same junction depth and impurity concentration (i.e., impurity concentration profile) as those of p-well 103aa.

The minimum designed distance determined by a mask between p-well 103aa and p-well 103b is about 1.5 µm. The side surfaces of p-well 103aa are surrounded by and coupled to the inner side surface of annular n-well 102aa, while side surfaces of p-well 103b are coupled to the outer side surface of N-well 102aa and the side surface of n-well 102b. A buried, third n-well 112 is further provided within p-substrate 101. N-well 112 is Coupled to the bottom surface of p-well 103aa and to a part of the bottom surface of n-well 102aa in the vicinity of p-well 103aa. N-well 112 is located at the depth range extending from about 1.0 µm to about 2.5 µm as measured from the main surface of p-substrate 101, and the impurity concentration of n-well 112 is higher than that of n-well 102aa.

A field oxide film 104 formed by a LOCOS technology is provided on the surface of p-substrate 101. The field oxide film 104 has a thickness of about 300 nanometers (nm) and has first through fourth openings 114a, 114b, 114c and 114d which have not been oxidized by the LOCOS technology. Opening 114a is provided on the third surface region within which p-well 103aa is provided. Opening 114b is provided such that it is separated from opening 114a by a distance of 3 µm, for example, extending from an edge portion of the third surface region within which n-well 102aa is provided toward the first surface region. Opening 114c is provided on the second surface region within which n-well 102b is provided. Opening 114d is provided on the fourth surface region within which p-well 103b is provided. Gate oxide films 105 having a thickness of about 10 nm are formed on the surface regions of p-substrate 101 which correspond to first through fourth openings 114a, 114b, 114c and 114d.

Gate electrode 106a of the high voltage MOSFET having a gate length of about 5 µm is provided at the location which is offset from opening 114a toward opening 114b by a distance of about 2 µm. Gate electrode 106a overlies p-well 103aa with the intervention of a 1 µm-wide field oxide film 104 and a 1 µm-wide gate oxide film 105, and also overlies n-well 102aa with the intervention of a 3 µm-wide gate oxide film 105. In other words, part of opening 114b is covered by gate electrode 106a with the intervention of gate oxide film 105.

Above the second surface region, gate electrode 106b is provided on n-well 102b with the intervention of gate oxide film 105. In other words, part of opening 114c is covered by gate electrode 106a with the intervention of gate oxide film 105.

Above the fourth surface region, gate electrode 106b is provided to overly p-well 102b with the intervention of gate oxide film 105. In other words, part of opening 114c is covered by gate electrode 106b with the intervention of gate oxide film 105. Above the fourth surface region, gate electrode 106c is provided to overly p-well 103b with the intervention of gate oxide film 105. In other words, part of opening 114d is covered by gate electrode 106c with the intervention of gate oxide film 105.

A first $p^{30}$ diffused region 107a is formed at the surface of p-well 103aa by self-alignment with field oxide film 104 or opening 114a. A second p+diffused region 107b is formed at the surface of n-well 102aa by self-alignment with gate electrode 106a and field oxide film 104 or opening 114b. A pair of third $p^{30}$ diffused regions 107c are formed at the surface of n-well 102b by self-alignment with gate electrode 106b and field oxide film 104 or opening 114c. The junction depths of $p^{30}$ diffused regions 107a, 107b and 107c are about 0.2 µm each, and the impurity concentrations of $p^{30}$ diffused regions 107a, 107b and 107c are equal to each other. A pair of $n^{30}$ diffused regions 108 are formed at the surface of p-well 103b by self-alignment with gate electrode 106c and field oxide film 104 or opening 114d. The junction depths of $n^{30}$ diffused regions 108 are about 0.15 µm each.

In the present embodiment, as described above, the p-channel high voltage MOSFET constituting the final stage transistor of the output buffer is provided at the surfaces of n-well 102aa and p-well 103aa both coupled to n-well 112, and has a drain region formed by p-well 103aa and $p^{30}$ diffused region 107a, a source region formed by $p^{30}$ diffused region 107b, gate oxide film 105, and gate electrode 106a. The p-channel MOSFET of the CMOS implementing an internal circuit is provided at the surface of n-well 102b, and has source and drain regions formed by the pair of $p^{30}$ diffused regions 107c, gate oxide film 105, and gate electrode 106b. The n-channel MOSFET of the CMOS is provided at the surface of p-well 103b, and has source and drain regions formed by the pair of $N^{30}$ diffused regions 108, gate oxide film 105, and gate electrode 106c.

Figure 3A:
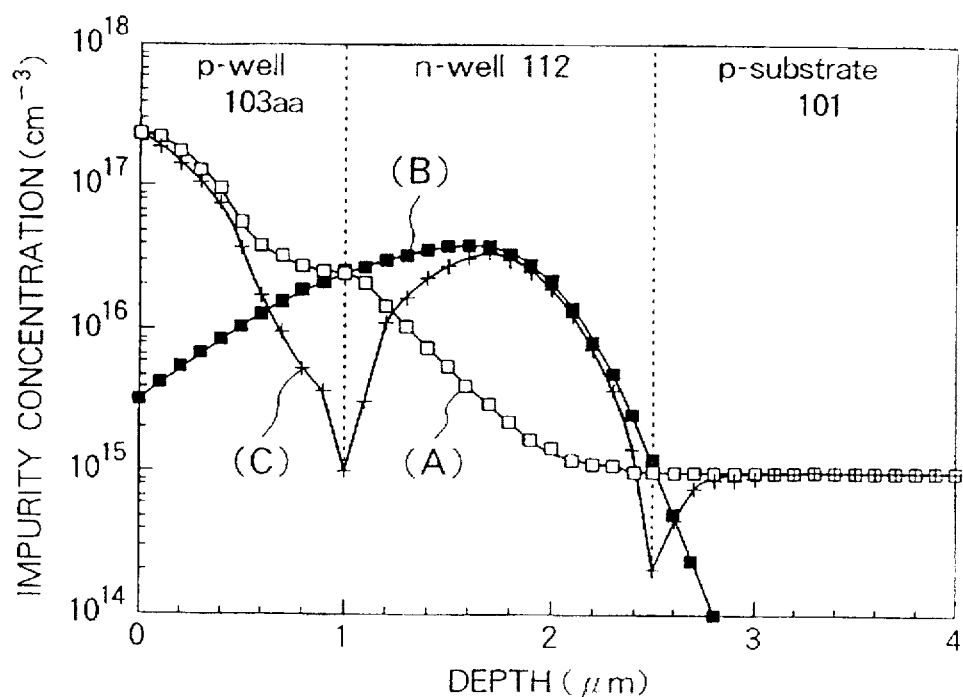
FIGS. 3A and 3B are graphs each showing impurity concentration profile in the high voltage semiconductor device of the first embodiment.
Figure 3B:
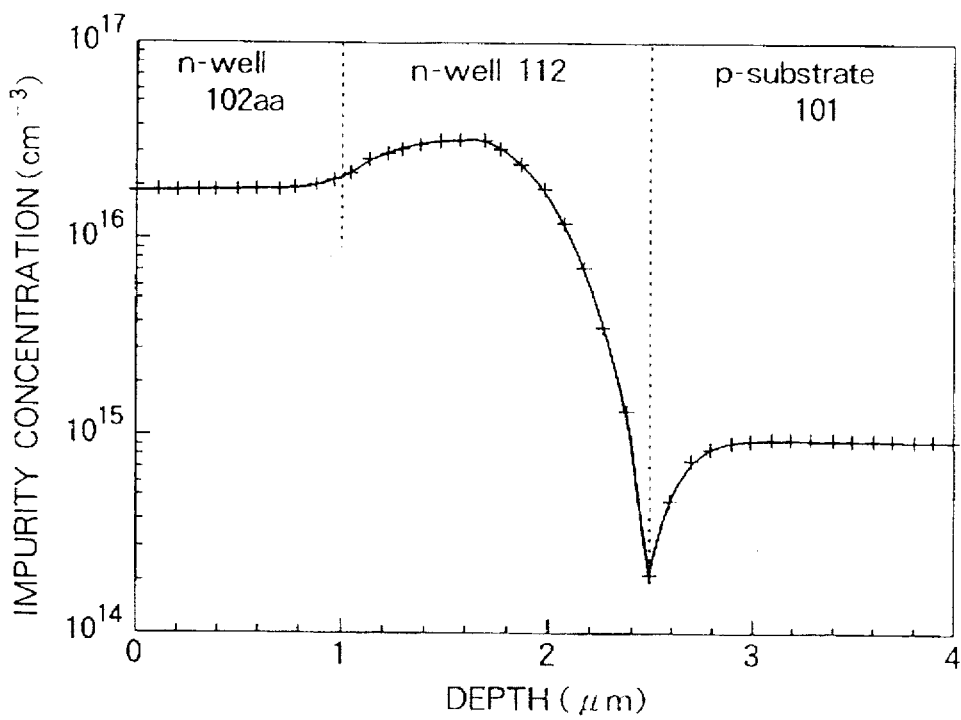

Referring to FIGS. 3A and 3B, there are shown impurity concentration profiles along line A—A and line B—B in FIG. 2A. FIG. 3A shows the impurity concentration profiles of p-well 103aa constituting the drain region in the vicinity of the channel region of the p-channel high voltage MOSFET. Graphs (A), (B) and (C) show impurity concentration profiles of p-ions, n-ions and final state, respectively, along p-well 103aa, n-well 112 and p-substrate 101. FIG. 3B shows the impurity concentration profile along n-wells 102aa, n-well 112 and p-substrate 101, namely, at the channel region and in the vicinity of the drain region.

P-well 103aa forming the drain region has a junction depth of about 1.0 µm, and the bottom surface of p-well 103aa is coupled to n-well 112. The thickness of n-well 112 is about 1.5 µm at the portion beneath the bottom surface of p-well 103aa. In the portion under the channel region and in the vicinity of the drain region, n-well 112 having a thickness of about 1.5 µm is provided beneath n-well 102aa while coupled thereto. The impurity concentration of n-well 112 is higher than that of n-well 102aa as shown in FIG. 3B.

The impurity concentration of n-well 112 is about ten times higher than that of prior art n-well 312 at the bottom of p-well 313 which has been described with reference to FIGS. 1A through 1H. Therefore, punch-through can be prevented even though the thickness of n-well 112 is smaller than that of the portion of n-well 312 beneath p-well 313 in FIG. 1H. That is, heavily doped n-well 112 prevents vertical punch through between p-well 103aa and p-substrate 101 even with a small junction depth of n-well 102aa. Although it is sufficient for n-well 112 to have a thickness of about 1.0 μm so as to prevent vertical punch-through, the thickness of n-well 112 is designed, however, as high as 1.5 μm in this embodiment due to the manufacturing process employed herein.

As is apparent from FIG. 3B, the impurity concentration of n-well 102aa is generally constant at depthwise positions. Therefore, if the minimum designed width of n-well 102aa is as large as 1.5 m at the portion between p-well 103aa and p-well 103b, lateral punch-through between p-well 103aa and p-well 103b can be prevented. As described above, since the junction depth of n-well 102aa can be decreased, it is possible to solve the conventional problem that the area occupied by the p-channel high voltage MOSFET increases due to the lateral extension of n-well 102aa.

N-well 112 has a higher impurity concentration than n-well 102aa. That is, the first junction formed by n-well 112 and p-well 103aa has a lower breakdown voltage against a reverse-biasing pulse than the second junction formed by n-well 102aa and p-well 103aa. Therefore, the first junction breaks prior to the break-down of the second junction. When high surge pulse of a negative potential enters from a power supply line Lo the drain 107a of the p-channel high voltage MOSFET, the break-down of the junction for p-well 103aa occurs at a deep location of p-well 103aa which is far from the gate oxide film 105, so that the gate oxide film 105 is not subjected to break-down caused by the high surge pulse. Accordingly, damage of the gate oxide film can be prevented, and it is unnecessary to provide a protection diode for this purpose.

The high voltage semiconductor device according to the first embodiment can be manufactured by a method according to an embodiment of the present invention, as detailed below with reference to FIGS. 4A to 4E.

Figure 4A:
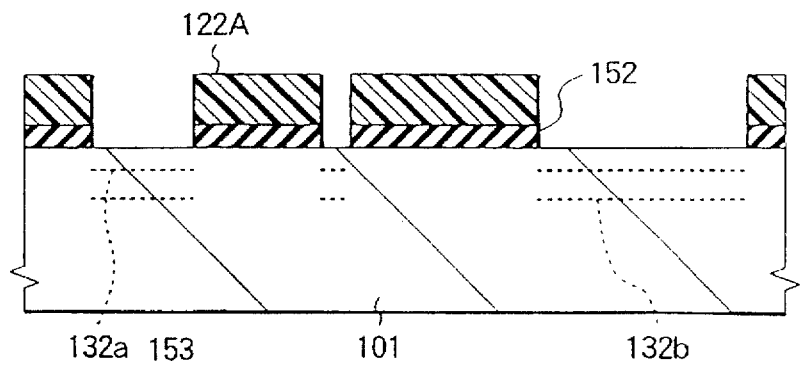
FIGS. 4A through 4E are schematic sectional views of the high voltage semiconductor device of FIGS. 2A and 2B in consecutive steps of a method for manufacturing the high voltage semiconductor device.

Referring to FIG. 4A, an unillustrated pad oxide film and a silicon nitride film 152 having a thickness of about 100 μnm are formed on a p-substrate 101. A photoresist film pattern 122A is formed which has a thickness of about 2 μm and openings at an annular first surface region of p-substrate 101 and a second surface region separated from the first surface region. Silicon nitride film 152 is selectively removed by etching using photoresist film pattern 122A as a mask. Subsequently, using photoresist film pattern 122A and silicon nitride film 152 as a mask, implantation of phosphorous ions is performed at an acceleration energy of 400 KeV and a dosage for example, 1×10$^{12}$ cm$^{-2}$, for example, and is again performed at an acceleration energy of 800 KeV and a dosage of 1×10$^{12}$ cm$^{-2}$, for example. As a consequence, phosphorous ion implanted layers 132a and 132b are formed within p-substrate 101 under the first and second surface regions.

After removal of photoresist film pattern 122A and pad oxide film, thermal oxidization is carried out at 1000° C. for about 1 hour using silicon nitride film 152 as a mask, so that silicon oxide films 153 each having a thickness of about 1 μm are formed on the first and second surface regions. During the thermal oxidization, phosphorous ion implanted layers 132a and 132b are activated to form n-wells 102a and 102b in the first and second surface regions, respectively. Each of n-wells 102a and 102b has a junction depth of about 1.2 μm. Each of n-well 102a and 102b has a uniform impurity concentration profile in a depthwise direction because of the two implanted layers 132a and 132b. After removal of silicon nitride film 152, implantation of boron ions is performed using silicon oxide film 153 as a mask at an acceleration energy of 300 KeV and a dosage of 4×10$^{11}$ cm$^{-2}$, for example. As a consequence, boron ion implanted layers 133a are formed within p-substrate 101 under the third surface region, surrounded by the first surface region, and the remaining fourth surface region.

Figure 4B:
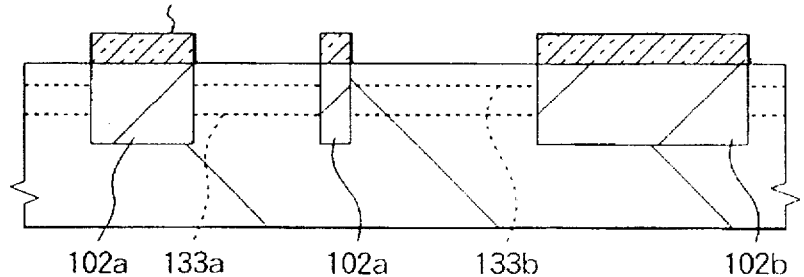

Subsequently, using silicon oxide film 153 as a mask, implantation of boron ions is performed at an acceleration energy of 100 KeV and a dosage of 1×10$^{12}$ cm$^{-2}$, and is again performed at an acceleration energy of 30 KeV and a dosage of 4×10$^{12}$ cm$^{-2}$, for example As a consequence boron ion implanted layers 133b are formed within p-substrate 101 under the third and fourth surface regions and above the implanted layers 133a (FIG. 4B).

Figure 4C:
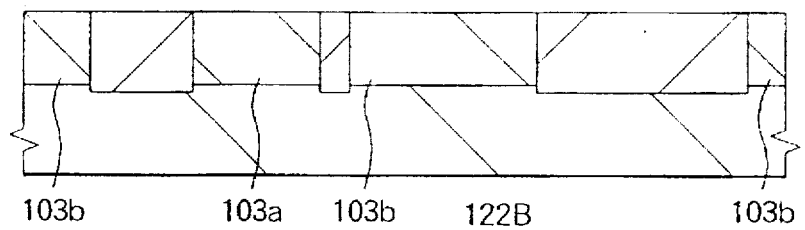

After removal of silicon oxide film 153 and pad oxide film, thermal oxidization is carried out at 950° C., so that a sacrificial oxide film (not shown) having a thickness of about 40 nm is formed on the surface of p-substrate 101. During the thermal oxidization, boron ion implanted layers 133a and 133b are activated to form p-wells 103a and 103b in the third and fourth surface regions, respectively. Each of p-wells 103a and 103b has a junction depth of about 1.0 μm (FIG. 4C).

Figure 4D:
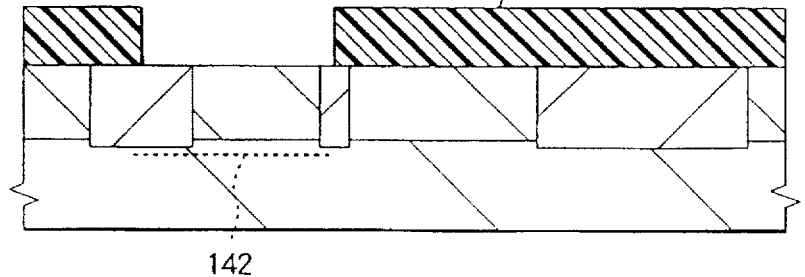
Figure 4E:
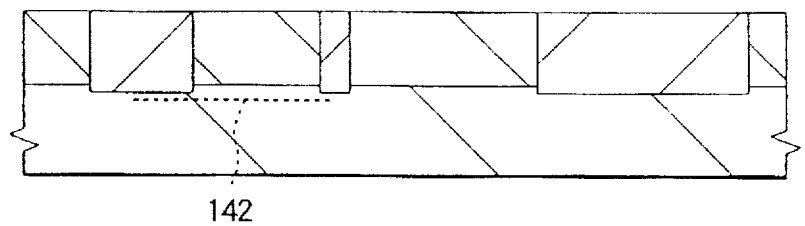

Thereafter, implantation of phosphorous ions is performed at an acceleration energy of 1 MeV and a dosage of 4×10$^{12}$ cm$^{-2}$, for example, while using a photoresist film 122B as a mask which has a thickness of about 2 μm and has an opening exposing the third surface region and an inner portion of the annular first surface region adjacent to the third surface region. As a consequence, a phosphorous ion implanted layer 142 is formed in p-substrate 101 at a position deeper than the bottom of n-well 102a and p-well 103a (FIG. 4D). Subsequently, photoresist film 122B and sacrificial oxide film are removed (FIG. 4E).

A silicon nitride film pattern is formed above surface regions of p-substrate 101 where openings 114a, 114b, 114c and 114d are to be formed. While using the silicon nitride film pattern as a mask, selective oxidization is performed at 980° C. so as to form a field oxide film 104 having a thickness of about 300 nm on the surface of p-substrate 101. During the selective oxidization, phosphorous ion implanted layer 142 is activated to form an n-well 112. By this step, n-well 102a turned n-well 102aa while p-well 103a turned to p-well 103aa, as shown in FIG. 2A, in which a part of the bottom of n-well 102aa is flush with the bottom of p-well 103aa and the top surface of n-well 112. The desired function can be obtained when n-well 112 exists in the depth range between 1 and 2 μm as measured from the surface. However, n-well 102aa is actually formed in the depth range between 1 and 2.5 μm due to the use of high energy ion implantation.

After the silicon nitride film left on the selected areas of the surface of p-substrate 101 is removed, those selected areas become the first through fourth openings 114a, 114b, 114c and 114d. Thereafter, a gate oxide film 105 having a thickness of about 10 nm is formed in the areas corresponding to the openings 114a, 114b, 114c and 114d by thermal oxidization at 900° C. Moreover, ion implantation is performed so as to adjust the threshold value depending on the desired characteristics of the device. Subsequently, gate electrodes 106a, 106b and 106e are formed.

Arsenic ions or the like are implanted at an acceleration energy of 70 KeV and a dosage of 3×10$^{13}$ cm$^{-2}$, for example, while using an unillustrated photoresist film covering predetermined portions of openings 114a, 114b and 114c, gate electrode 106c and field oxide film 104 as a mask.

As a consequence, n+diffused regions 108 constituting the source and drain of n-channel MOSFET of the CMOS are formed in surface regions of p-well 103b corresponding to opening 114d by self-alignment with field oxide film 104 and gate electrode 106c. Subsequently, boron difluoride (BF$_2$) ions or the like are implanted at an acceleration energy of 70 KeV and a dosage of $3 \times 10^{15}$ cm$^{-2}$ for example, while using an unillustrated photoresist film covering a predetermined portion of opening 114d, gate electrodes 106a and 106b and field oxide film 104 as a mask.

As a consequence, a p+diffused region 107a constituting the drain of the high voltage MOSFET is formed in a surface region of p-well 103aa corresponding to opening 114a by self-alignment with field oxide film 104. Also, a p+diffused region 107b constituting the source of the high voltage MOSFET is formed in a surface region of n-well 102aa corresponding to opening 114b by self-alignment with field oxide film 104 and gate electrode 106a. Similarly, p+diffused regions 107c constituting the source and drain of the p-channel MOSFET of the CMOS are formed in surface regions of n-well 102b corresponding to opening 114c by self-alignment with field oxide film 104 and gate electrode 106b, thereby obtaining the structure of FIGS. 2A and 2B. Although an n+diffused region for n-well contact and a p+diffused region for p-well contact are not shown in the drawings, these layers may be proved if needed.

The high voltage semiconductor device according to the first embodiment can be also manufactured by the following alternative method shown in FIGS. 5A through 5D.

Figure 5A:
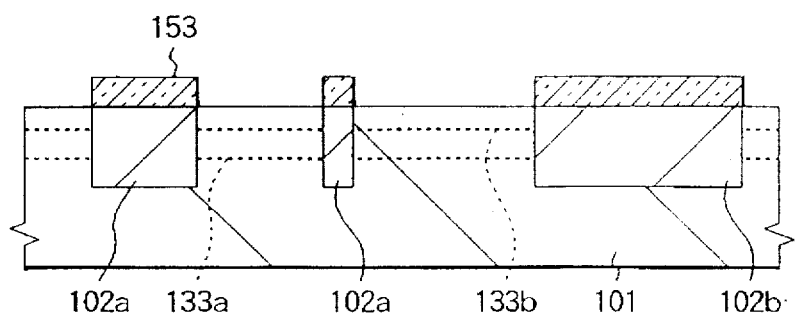
FIGS. 5A through 5D are schematic sectional views of the high voltage semiconductor device of FIGS. 2A and 2B in consecutive steps of another method for manufacturing the high voltage semiconductor device.

Referring to FIG. 5A, there is shown a silicon p-substrate 101 which has been subjected to selective oxidation for the formation of silicon oxide film 158, to ion-implantation and subsequent heat-treatment for the formation of n-wells 102a and 102b, and to ion implantation for forming boron implanted layers 138a and 138b, which were performed in steps similar to those in the method as described before in connection with the first method.

Figure 5B:
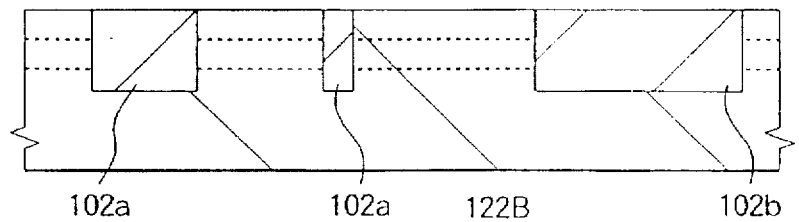
Figure 5C:
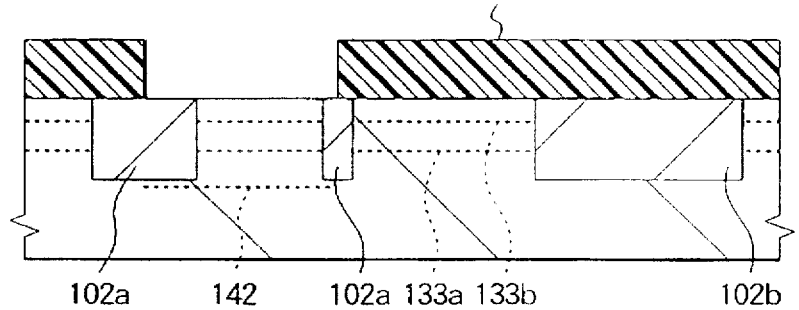
Figure 5D:
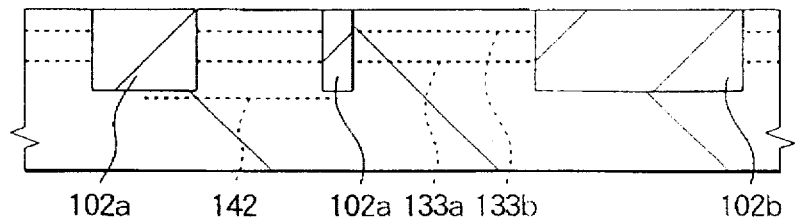

After removal of silicon oxide film 153, an unillustrated silicon oxide film having a thickness of about 400 nm is formed on the surface of p-substrate 101 by atmospheric pressure chemical vapor deposition (APCVD) (FIG. 5B). Subsequently, phosphorous ion implanted layer 142 is formed by ion implantation using a photoresist film pattern 122B as a mask (FIG. 5C). Thereafter, photoresist film pattern 122B and the silicon oxide film are removed (FIG. 5D). The remaining steps are similar to those in the method as described before.

Although the high voltage semiconductor device according to the first embodiment includes a p-channel high voltage MOSFET, it can be applied to an n-channel high voltage MOSFET having a maximum rated voltage of about −40 V, for example. In this modification, n-substrate is used instead of p-substrate 101. Ion implantation steps for forming first and second p-wells instead of n-wells 102a and 102b include first boron ion implantation performed at an acceleration energy of 100 KeV and a dosage of $4 \times 10^{12}$ cm$^{-2}$, and a second boron ion implantation performed at an acceleration energy of 30 KeV and a dosage of $4 \times 10^{12}$ cm$^{-2}$, for example. Ion implantation to form first and second n-wells instead of p-wells includes first: phosphorous ion implantation performed at an acceleration energy of 700 KeV and a dosage of $1 \times 10^{12}$ cm$^{-2}$, second phosphorous ion implantation performed at an acceleration energy of 400 KeV and a dosage of $8 \times 10^{11}$ cm$^{-2}$, and third phosphorous ion implantation performed at an acceleration energy of 150 KeV and a dosage of $5 \times 10^{12}$ cm$^{-2}$, for example, ion implantation to form a third p-well instead of n-well includes a first boron ion implantation performed at an acceleration energy of 800 KeV and a dosage of $1.3 \times 10^{12}$ cm$^{-2}$, and a second boron ion implantation performed at an acceleration energy of 1 MeV and a dosage of $3 \times 10^{12}$ cm$^{\times 2}$, for example.

A high voltage semiconductor device according to a second embodiment of the present invention will be described with reference to FIGS. 6A through 6E. The high voltage semiconductor device of the present embodiment also includes a p-channel high voltage MOSFET and a CMOSFET, which are designed in accordance with a 0.5 m design rule. The high voltage semiconductor device of the present embodiment is also suitable for use in driving a fluorescent character display tube.

The high voltage semiconductor device of the present embodiment has a configuration similar to that of the first embodiment except that the first p-well for implementing a part of the drain of the high voltage MOSFET is not provided in the region surrounded by the first n-well in which the high voltage MOSFET is formed, but is formed within the first n-well itself, and that designed gaps (defined by the mask) are provided between the first n-well and the second p-well and between the second p-well and the second n-well. The high voltage semiconductor device according to the present embodiment can be manufactured as detailed below.

Figure 6A:
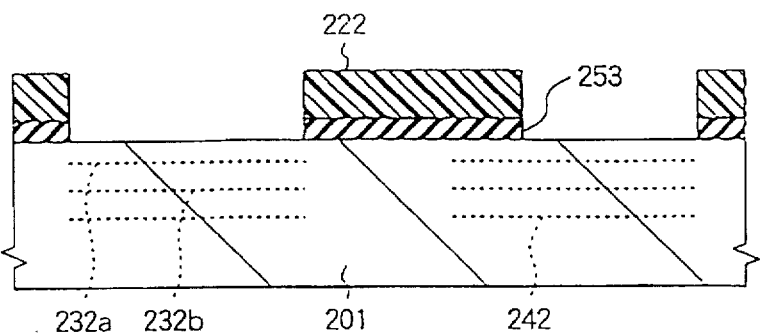
FIGS. 6A through 6E are schematic sectional views of a high voltage semiconductor device according to a second embodiment of the present invention in consecutive steps of a method for manufacturing the high voltage semiconductor device.

A silicon oxide film 253 having a thickness of about 1 μm is formed on the surface of a silicon p-substrate 201 by thermal oxidation performed at 1000° C. for about 1 hour. A photoresist film pattern 222 having a thickness of about 2 μm is formed on the surface of silicon oxide film 253. The photoresist film pattern 222 has an opening corresponding to a first surface region including a region in which a p-channel high voltage MOSFET is to be formed, and an opening corresponding to a second surface region including a region in which a p-channel MOSFET of CMOS forming an internal circuit is to be formed. Silicon oxide film 253 is etched using photoresist film 222 as a mask to expose the first and second surface regions. Subsequently, using photoresist film pattern 222 and part of silicon oxide film 253 left after the etching, as a mask, implantation of phosphorous ions is performed at an acceleration energy of 400 KeV and a dosage of $1 \times 10^{-2}$, for example, then again performed at an acceleration energy of 800 KeV and a dosage of $1 \times 10^{12}$ cm$^{-2}$, for example, and finally performed at an acceleration energy of 1 MeV and a dosage of $4 \times 10^{12}$ cm$^{-2}$, for example. As a consequence, phosphorous ion implanted layers 232a, 232b and 242 are formed in the first and second surface regions (FIG. 6A).

Figure 6B:
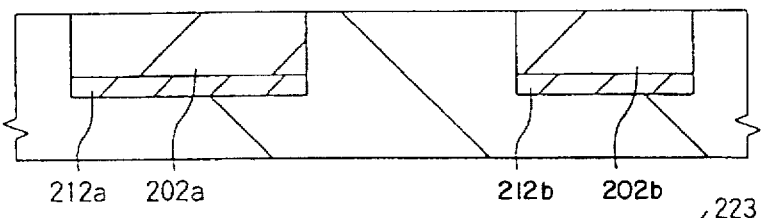

After successive removal of photoresist film pattern 222 and silicon oxide film 253, a sacrificial oxide film (not shown) having a thickness of about 40 nm is formed on the surface of p-substrate 201 by thermal oxidation. Due to this thermal oxidation, phosphorous ion implanted layers 232a and 232b are activated to form a first n-well 202a in the first surface region and a second n-well 202b in the second surface region. At the same step, phosphorous ion implanted layer 242 is activated to form a third n-well 212a coupled to the bottom of n-well 202a and a fourth n-well 212b coupled to the bottom of n-well 202b. N-wells 212a and 212b have impurity concentrations higher than those of n-wells 202a and 202b, and are formed in the depth range extending from 1 μm to 2.5 μm as measured from the surface of the substrate (FIG. 6B).

Subsequently, a photoresist film pattern 223 having a thickness of about 1 μm is formed on the surface of the sacrificial oxide film. This photoresist film pattern 223 has an opening corresponding to a third surface region, in which the drain region of the p-channel high voltage MOSFET is to be formed and which is surrounded by the first surface region, and an opening corresponding to a fourth surface region including a region in which an n-channel MOSFET of the CMOS forming the internal circuit is to be formed. The fourth region is separated from the first and second regions by a distance of about 0.5 µm in a designed value of the mask. This separation is provided so as to facilitate mask alignment. The third and fourth regions are separated from each other by a distance of about 1.5 µm in designed value of the mask. This separation is provided so as to prevent lateral punch-through in the drain region of the high voltage MOSFET.

Figure 6C:
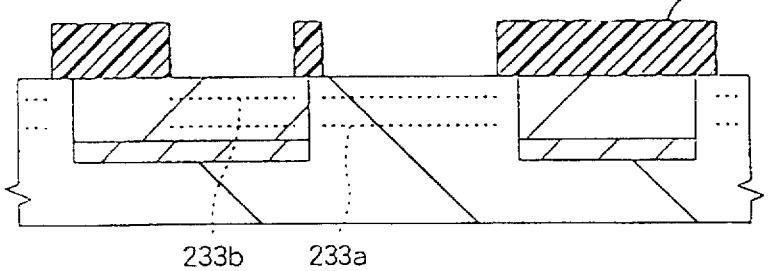
Figure 6D:
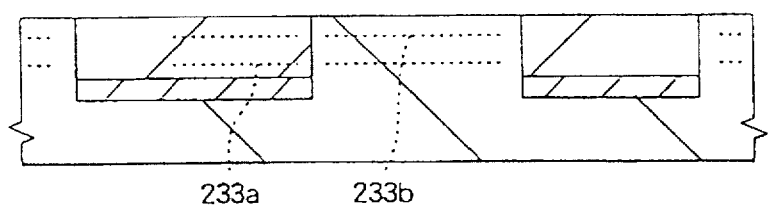

Using photoresist film 223 as a mask, implantation of boron ions is performed at an acceleration energy of 400 KeV and a dosage of $1.4 \times 10^{12}$ cm$^{-2}$, for example. As a consequence, boron ion implanted layers 233a are formed within p-substrate 201 under the third surface region surrounded by the first surface region and the fourth surface region. Subsequently, using photoresist film 223 as a mask, implantation of boron ions is performed at an acceleration energy of 100 KeV and a dosage of $1.5 \times 10^{12}$ cm$^{-2}$, and is again performed at an acceleration energy of 30 KeV and a dosage of $4 \times 10^{12}$ cm$^{-2}$, for example. As a consequence, born ion implanted layers 233b are formed within p-substrate 201 under the third and fourth surface regions (FIG. 6C). Subsequently, photoresist film 223 and the sacrificial oxide film are successively removed (FIG. 6D).

Thereafter, the following steps are performed as in the first embodiment. A silicon nitride film pattern is formed on surface areas of p-substrate 201 where first through fourth openings are to be formed. The first opening is provided on the third surface region within which p-well 203a is provided. The second opening is provided such that it is separated from the first opening by a distance of 3 µm, for example, and extends from the third surface region, within which n-well 202aa is provided, toward the first surface region. The third opening is provided on the second surface region within which n-well 202b is provided. The fourth opening is provided on the fourth surface region within which p-well 203b is provided.

By using the silicon nitride films as a mask, selective oxidization is performed so as to form a field oxide film 204 having a thickness of about 300 nm on the surface of p-substrate 201. During the selective oxidization, boron ion implanted layers 233a and 233b are activated to form a first p-well 203a in the third region, and a second p-well 203b in the fourth region. With this process, n-well 202a turns to n-well 202aa, while n-well 212a turns to n-well 212aa. Since p-well 203a is formed within n-well 202aa, the impurity concentration of p-well 203a is lower than that of p-well 203b.

After removal of the silicon nitride film, a gate oxide film 205 having a thickness of about 10 nm is formed in the areas corresponding to the first through fourth openings by thermal oxidization at 900° C. Subsequent ion implantation is performed to adjust the threshold of the MOSFETs depending on the desired characteristics of the device. Thereafter, first through third gate electrodes 206a, 206b and 206c are formed simultaneously. The first gate electrode 206a having a length of about 5 µm is formed at a position offset from the first opening toward the second opening by a distance of about 2 µm. The first gate electrode 206a overlies p-well 203a with the intervention of field oxide film 204 having a width of about 1 µm and gate oxide film 205 having a width of about 1 µm, and also overlies n-well 202aa with the intervention of gate oxide film 205 having a width of about 3 µm. In other words, part of the second opening is covered by gate electrode 206a with the intervention of gate oxide film 205.

Above the second surface region, the second gate electrode 206b is provided to overly n-well 202b with the intervention of gate oxide film 205. In other words, part of the third opening is covered by gate electrode 206b with the intervention of gate oxide film 205. Above the fourth surface region, the third gate electrode 206c is provided to overlay p-well 203b with the intervention of gate oxide film 205. In other words, part of the fourth opening is covered by gate electrode 206c with the intervention of gate oxide film 205.

Arsenic ions are implanted at an acceleration energy of 70 KeV and a dosage of $3 \times 10^{15}$ cm$^{-2}$, for example, while using an unillustrated photoresist film covering predetermined portions of the first, second and third openings, gate electrode 206c and field oxide film 204 as a mask. As a consequence, n$^+$diffused regions 208 are formed in surface regions of p-well 203b corresponding to the fourth opening by self-alignment with field oxide film 204 and gate electrode 206c. N$^+$diffused regions 208 have a junction depth of about 0.15 µm.

Subsequently, boron difluoride (BF$_2$) ions are implanted at an acceleration energy of 70 KeV and a dosage of $3 \times 10^{15}$ cm$^{-2}$, for example, while using an unillustrated photoresist film covering a predetermined portion of the fourth opening, gate electrodes 206a and 206b and field oxide film 204 as a mask. As a consequence, a p$^+$diffused region 207a is formed in a surface region of p-well 203aa corresponding to the first opening by self-alignment with field oxide film 204. Also, a p$^+$diffused region 207b is formed in a surface region of n-well 202aa corresponding to part of the second opening by self-alignment with field oxide film 204 and gate electrode 206a.

Figure 6E:
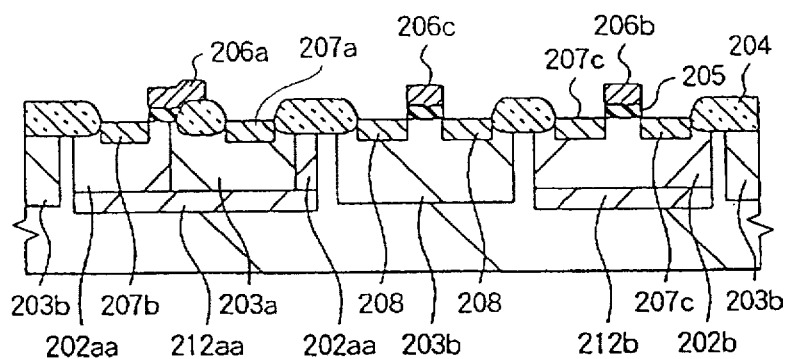

Similarly, p$^{30}$ diffused regions 207c are formed in surface regions of n-well 202b corresponding to the third opening by self-alignment with field oxide film 204 and gate electrode 206b. P$^{30}$ diffused regions 207a, 207b and 207c have a junction depth of about 0.2 µm (FIG. 6E). Although an n$^+$diffused region for n-well contact and a p$^+$diffused region for p-well contact are not shown in the drawings, these layers may be proved if needed.

In the present embodiment, a p-channel high voltage MOSFET constituting the final stage transistor of the output buffer is provided at the surface of n-well 202aa coupled to n-well 212a, and has a drain region formed by p-well 203a and p$^+$diffused region 207a, a source region formed by p$^+$diffused region 207b, gate oxide film 205, and gate electrode 206a. A p-channel MOSFET of a CMOS forming an internal circuit is provided at the surface of n-well 202b coupled to n-well 212b, and has source and drain regions formed by the pair of p$^+$diffusion layers 207c, gate oxide film 205, and gate electrode 206b. An n-channel MOSFET of the CMOS is provided at the surface of p-well 203b, and has source and drain regions formed by the pair of n$^+$diffused regions 208, gate oxide film 205, and gate electrode 206c.

The second embodiment has a similar advantage in reduction of the occupied area although the second embodiment is slightly larger than the first embodiment in size because n-well 202aa and p-well 203b are separated from each other with a distance of about 0.5 µm, and p-well 203b and n-well 202b are separated from each other by a distance of about 0.5 µm. The function of preventing electrostatic breakage of gate oxide film provided by the present embodiment is similar to that of the first embodiment. In the present embodiment, however, since the impurity concentration of the first p-well 203a can be decreased, the high voltage semiconductor device of the present embodiment can be operated at a higher absolute voltage compared to the first embodiment.

The structure of the second embodiment can be applied to a high voltage semiconductor device including an n-channel high voltage MOSFET as in the first embodiment.

Since above the embodiments are described only as examples, the present invention is not limited to such embodiments and it will be obvious for those skilled in the art that various modifications or alterations can be easily made based on the above embodiments within the scope of the present invention.

What is claimed is:

1. A semiconductor device comprising:

a semiconductor substrate of a first conductivity type;

a first well of a second conductivity type opposite to said first conductivity type, said first well being formed in an annular first surface region of said substrate;

a second well of said first conductivity type formed in a second surface region of said substrate surrounded by said first surface region, said second well having a side surface coupled to a side surface of said first well and a bottom surface substantially flush with at least a part of a bottom surface of said first well;

a third well of said second conductivity type formed within said substrate, said third well being coupled directly to said bottom surface of said second well and coupled directly to said at least a part of said bottom surface of said first well, said third well having an impurity concentration higher than an impurity concentration of said first well; and a MOSFET having a source formed in said first well, a drain formed in said second well, said source and drain being of said first conductivity type.

2. A semiconductor device as defined in claim 1 wherein said MOSFET of said first conductivity type has a rated voltage of 35 volts or higher.

3. A semiconductor device as defined in claim 2 further comprising a fourth well of said first conductivity and a fifth well of said second conductivity type both formed in a third and a fourth surface regions of said substrate, respectively, for receiving sources and drains of a CMOSFET.

4. A semiconductor device as defined in claim 3 wherein said fourth well has a side surface coupled to another side surface of said first well.

5. A semiconductor device as defined in claim 3 wherein said fourth well has a side surface apart from said first well.

6. A semiconductor device as defined in claim 1 wherein said MOSFET has a gate, overlying a junction between said first well and said second well, for controlling current flowing between said source and drain.

7. A semiconductor device as defined in claim 6 further comprising a field oxide film having a portion overlying a part of said second well and underlying a part of said gate.

8. A semiconductor device as defined in claim 1 wherein said first conductivity type is a p-conductivity type.

9. A semiconductor device as defined in claim 1 wherein said second conductivity type is an n-conductivity type.

10. A semiconductor device as defined in claim 1, wherein said first well is an annular surface region in said substrate.

11. A semiconductor device as defined in claim 10, wherein said second well is surrounded by said first well.

* * * * *

UNITED STATES PATENT AND TRADEMARK OFFICE
CERTIFICATE OF CORRECTION

PATENT NO. : 5,739,572
DATED : April 14, 1998
INVENTOR(S) : Ko NOGUCHI

It is certified that error(s) appears in the above-identified patent and that said Letters Patent is hereby corrected as shown below:

Col. 2, line 14, change "382" to --332--.

Col. 2, line 19, change "823" to --323--.

Col. 3, line 26, change "306b" to --306c--.

Col. 4, line 30, change "JP-A-1989-6251" to --JP-A-1989-64251--.

Col. 7, line 66, change "106a" to --106b--.

Col. 11, line 32, change "158" to --153--.

Col. 11, line 35, change "138a and 138b" to --133a and 133b--.

Signed and Sealed this

Nineteenth Day of January, 1999

Attest:

Attesting Officer

*Acting Commissioner of Patents and Trademarks*